United States Patent [19]
Garney

[11] Patent Number: 5,538,436
[45] Date of Patent: Jul. 23, 1996

[54] TWO-PART MEMORY CARD SOCKET CONNECTOR AND RELATED INTERRUPT HANDLER

[75] Inventor: John I. Garney, Aloha, Oreg.

[73] Assignee: Intel Corporation, Santa Clara, Calif.

[21] Appl. No.: 328,545

[22] Filed: Oct. 25, 1994

Related U.S. Application Data

[63] Continuation of Ser. No. 85,322, Jun. 29, 1993, abandoned.

[51] Int. Cl.⁶ .......................... H01R 11/22; H01R 25/00
[52] U.S. Cl. .................. 439/270; 439/122; 439/259; 439/489; 439/347; 361/754; 364/929.4; 364/929.51; 364/953.3; 395/500
[58] Field of Search ..................... 395/500; 439/270, 439/122, 489, 259, 347

[56] References Cited

U.S. PATENT DOCUMENTS

| | | | |
|---|---|---|---|
| 4,872,139 | 10/1989 | Okamoto et al. | 365/52 |
| 5,126,890 | 6/1992 | Wade et al. | 360/60 |
| 5,158,473 | 10/1992 | Takahashi et al. | 439/353 |
| 5,161,169 | 11/1992 | Galano et al. | 375/220 |
| 5,161,992 | 11/1992 | Birch | 439/260 |
| 5,210,855 | 5/1993 | Bartol | 395/500 |

OTHER PUBLICATIONS

Fukuhara JPO 01-303692 Installing System for Optional ROM Carrier.
Suzuki JPO 03-186914 Connection Device for IC Card.

Primary Examiner—Robert B. Harrell
Assistant Examiner—Kenneth R. Coulter
Attorney, Agent, or Firm—Blakely, Sokoloff, Taylor & Zafman

[57] ABSTRACT

An apparatus for handling the removal of a memory card from a computer system. The apparatus includes a socket for receiving the memory card having a first section of card detect pins and a second section of single pins. The second section is aligned with the first section during insertion of the card into the socket. The second section slides out with the card during removal of the card from the socket. The apparatus also includes an interrupt handler for transferring control to the interrupt handler upon a break in contact between the card and card detect pins in the socket. The interrupt handler disables signal lines connected to the signal pins before the second section begins pulling out from the card upon removal of the card from the socket.

38 Claims, 4 Drawing Sheets

U.S. Patent    Jul. 23, 1996    Sheet 1 of 4    5,538,436
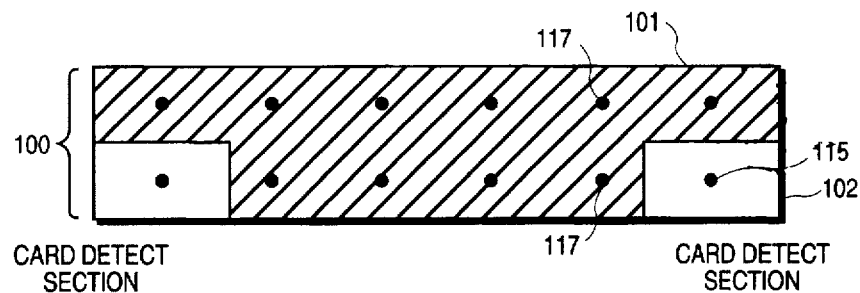
FIG. 1A (FRONT VIEW)
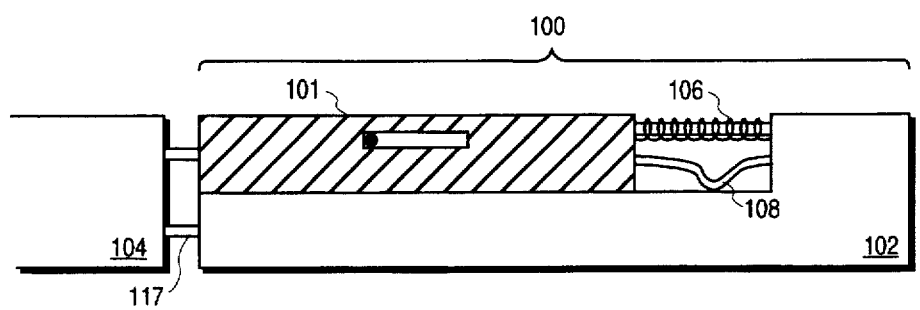
FIG. 1B (SIDE VIEW)
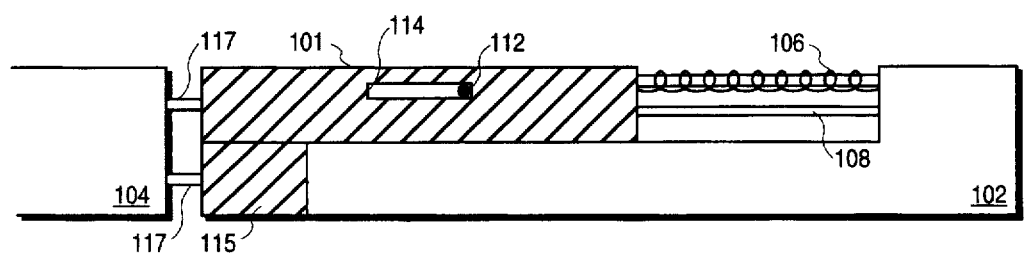
FIG. 1C (STATIONARY SIDE VIEW)

TWO-PART MEMORY CARD SOCKET CONNECTOR AND RELATED INTERRUPT HANDLER

This is a continuation of application Ser. No. 08/085,322 filed Jun. 29, 1993, now abandoned.

BACKGROUND OF THE INVENTION

1. Field of the Invention

The present invention relates to data processing systems, and more particularly to a method and apparatus for handling the removal of memory cards from a computer system.

2. Art Background

Recent advances in computer technology have made it possible to execute instruction code directly off of removable memory cards that are inserted into sockets on a processor circuit board. The cards typically are comprised of a read only memory (ROM), a static random access memory (SRAM), an erasable programmable read only memory (EPROM) or a flash memory. Upon insertion of the card into the socket, the address space of the card is mapped into the address space of the processor to permit execution of program code resident on the card.

Removable memory cards provide great flexibility to both the user and the computer service technician. As just a few examples, the cards can be used to provide bootstrap or test programs that can be quickly installed into the system. Because instructions are directly executable off of the cards, the user saves the time that would be required to load the card resident programs into system memory.

One problem with existing memory card technology is that the accidental removal of a card can lead to unreliable system behavior if the card is removed without the system first suspending execution of card-resident programs. To overcome this problem, some card connectors are provided with a mechanical lock that prevents the card from being removed until it is unlocked. The act of unlocking generates an interrupt to the system that triggers suspension of access to the card. A disadvantage of this solution is that the required locking hardware is relatively expensive.

All connectors implementing the Personal Computer Memory Card International Association (PCMCIA) standard utilize card detect pins that are shorter than the signal pins in the connector. Upon insertion of the card, the card detect pins of the socket contact the card last to indicate the presence of the card in the socket. These pins also break contact first upon card removal in order to signal the system that it should suspend access to the card.

The existing card standard exhibits two major reliability problems: (i) noise on the signal lines; and (ii) inadequate time for system response. First, as the card is being removed, the signal pins of the socket connector on the system side scrape against the corresponding holes of the connector on the card side, thus generating noise on the signal pins. This noise can cause unreliable system operation. Second, the existing standard only provides for a very short amount of time for the system to respond to card removal before the signal pins break contact.

The accidental removal of memory cards during the execution of card-resident software also leads to the creation of an invalid processor state. Whether on-card or off-card, most software executes procedure calls to different areas of system memory. This requires the processor to set its program counter to the address of the first instruction in the called procedure. To ensure resumption of execution of the calling program after the called routine has completed execution, the processor maintains a stack of "next instruction pointers" that point to the instruction to be executed in the calling program after the procedure call. Each next instruction pointer on the stack is also the last component of a stack frame that includes local variables pushed onto the stack for temporary use by the calling program.

As card resident code executes and calls routines either on-card or off-card, both local variables used by the card resident code and next instruction pointers referring to memory locations on the card are pushed onto the stack. When execution of card-resident is interrupted by accidental card removal, the stack frames relating to locations on the card are invalid unless the card is reinserted. Thus, there is need for an interrupt handler that responds to the break in the card detect pins to ensure that the invalid stack frames do not lead to unreliable system operation.

BRIEF SUMMARY OF THE INVENTION

The present invention provides an apparatus for handling the removal of a memory card from a computer system. The apparatus includes a socket for receiving the memory card having a first section of card detect pins and a second section of signal pins. The second section is aligned with the first section at a first position during insertion of the card into the socket. The second section is slidable in a direction of card removal to a second position during the removal of the card from the socket. The apparatus also includes an interrupt handler that transfers control to the interrupt handler upon a break in contact of the card and the card detect pins. The interrupt handler disables signal lines connected to the signal pins before the second section begins pulling out from the card upon removal of the card from the socket.

DETAILED DESCRIPTION OF THE DRAWINGS

FIG. 1A is a front view of the socket connector of the present invention.

FIGS. 1B and 1C are side views of the socket connector of the present invention.

DETAILED DESCRIPTION OF THE INVENTION

Figure 1D:
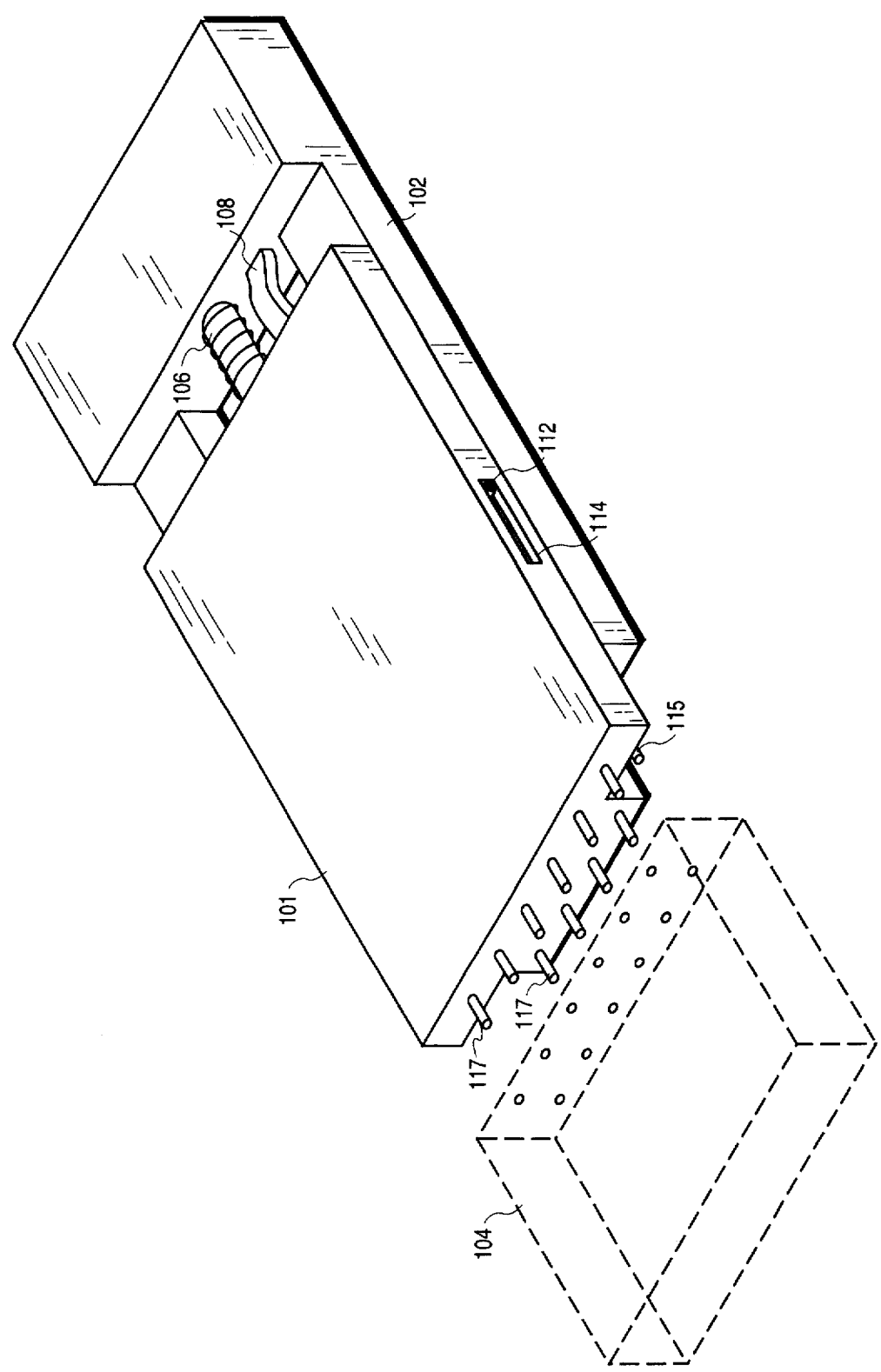
FIG. 1D is a three-dimensional view illustrating a card connector being removed from the socket connector of the present invention.

The present invention proves a method and apparatus for handling card removal interrupts. For purposes of explanation, specific embodiments are set forth to provide a thorough understanding of the present invention. However, it will be apparent to one skilled in the art that the invention may be practiced without these details. In other instances, well known elements, devices, process steps and the like are not set forth in detail to avoid unnecessarily obscuring the present invention.

The present invention provides a two part memory card socket connector and related interrupt handler. The connector eliminates noise on the signal lines while the card is being removed during execution of card-resident code. The connector also guarantees that, after the card detect pins disconnect, the signal pins maintain contact with the card for a sufficient period of time to allow the interrupt handler to achieve system recovery from the card removal.

FIGS. 1A, 1B and 1C are front and side views of an embodiment of the socket connector 100 of the present invention. The socket connector is divided into two parts—a signal section 101 holding signal pins 117 and a card detect section 102 bearing card detect pins 115. Of course, in another embodiment, the pins may be located on the card side and the corresponding contacts on the system side.

Figure 2:
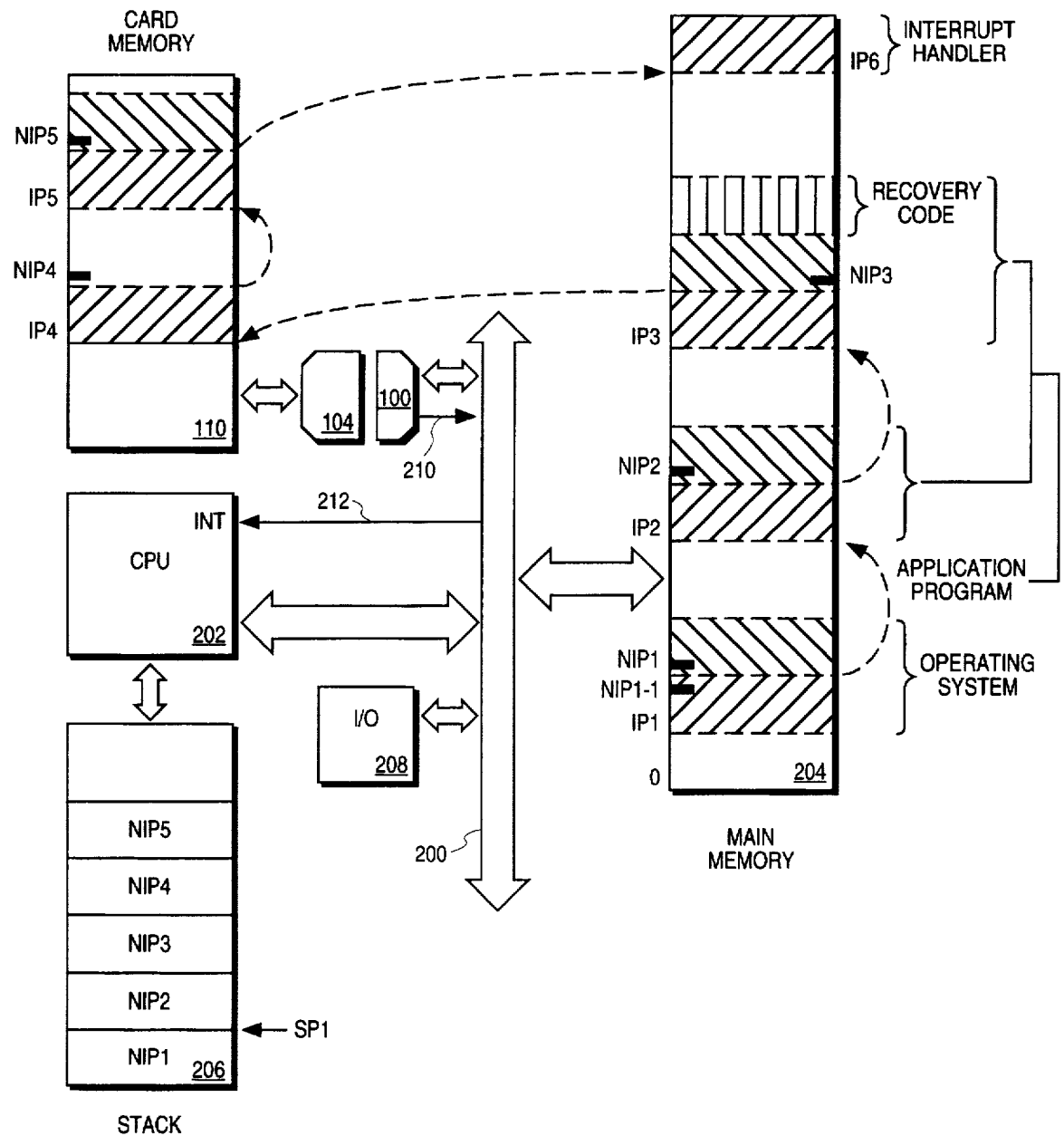
FIG. 2 illustrates the system of the present invention.

FIGS. 1B and 1C are side views of the socket connector 100 interacting with the complementary connector 104 of a card 110 (shown in FIG. 2). The signal section 101 is slidably connected to the rest of the socket connector 100 by a rod wound with a spring 106. A flexible cable 108 provides electrical contact between the signal pins 117 in section 101 and the fixed part 102 of the socket connector 100.

FIGS. 1C and 1D show the card connector 104 as it is being removed from the socket connector 100. As the card 104 is pulled out of the socket, the card detect pins 115 of the card detect section 102 break contact first because that section is integral with the socket connector. However, the pins of the signal section will remain in the card connector 104 and the spring 106 will extend until a detent 112 hits the end of a groove 114 in the signal section. At that point the signal pins will begin to scrape against the contacts in the card connector 104. Although this scraping would usually create noise on the signal lines, the socket connector 100 of the present invention is designed so that the system has enough time to respond to the card removal notification provided by the card detect pins before signal pins begin sliding out of the card connector 104. The response time is controlled by a number of factors, including the length of the card detect pins and the length of the groove 114.

Once the pins in the socket 100 break contact with the card connector 104, the movable signal section 101 will be pulled back into its normal position by spring 106. The socket is then ready for the next insertion.

Figure 3:
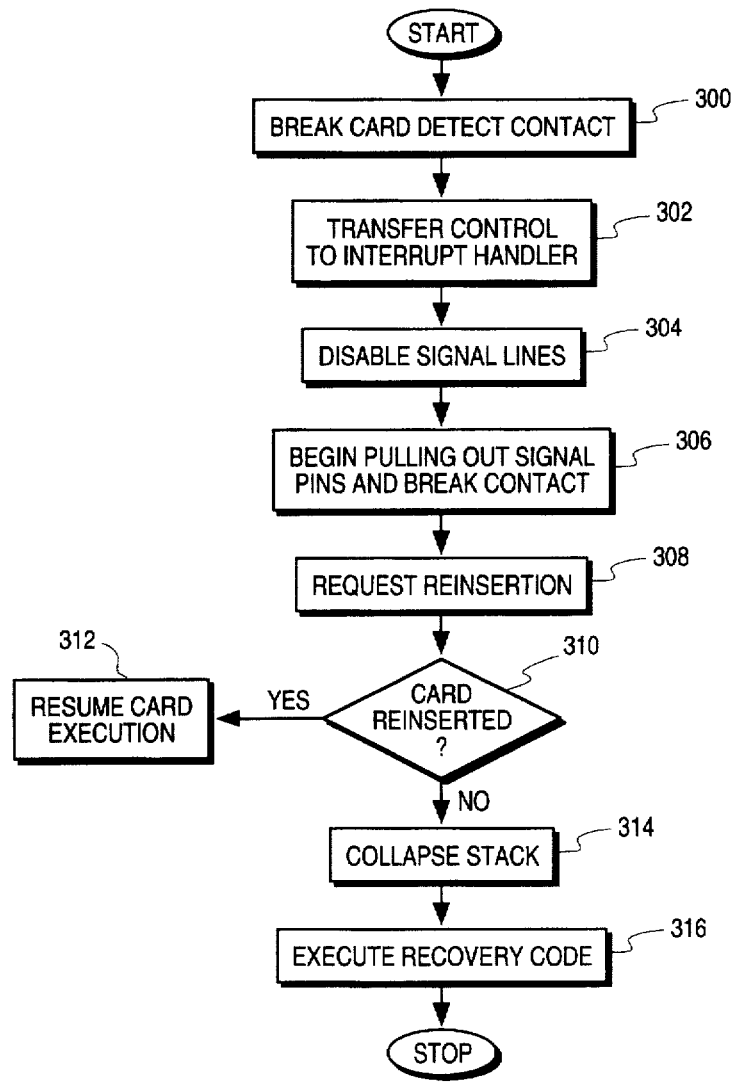
FIG. 3 is a flowchart of the method of the present invention.

The associated interrupt handler of the present invention will now be described with reference to the system of FIG. 2 and the flowchart of FIG. 3. The socket connector 100 and card connector 104 arrangement provides electrical contact between memory card 110 and bus 200. Processor (CPU) 202 and main memory 204 are also coupled to bus 200. The processor 202 executes instructions and accesses data from areas residing both in main memory 204 and card 110. During the execution of instruction code, processor 202 typically encounters branching instructions such as conditional statements or subroutine calls. As an example, in FIG. 2 the processor 202 begins execution of a section of code starting with the instruction found at memory location IP1. IP1 may represent the first instruction of the operating system. Execution of that code continues until the processor executes a call instruction found at address NIP1-1, at which point the processor jumps to address IP2, the destination address of the call instruction, and resumes execution. IP2 may, for example, represent the start of an application program. When processor 202 executes the call instruction it also pushes onto the stack 206 a next instruction pointer NIP1, which is the address of the next instruction in the calling program that is to be executed after the subroutine has completed execution. Of course, in some instances, execution may never be returned to the calling program, but may be terminated in a called routine.

FIG. 2 goes on to show, as an example, a call to address IP3, execution of the code section starting at that address, and storage of next instruction pointer NIP2 on the stack 206. That section of code then calls for execution of instructions on the card 110 starting at address IP4 (mapped into the processor address space), and storage of NIP3 on the stack. Execution then is called to IP5 on the card, and NIP4 is pushed onto the stack. It is during execution of the code starting at that address that, in this example, the card connector 104 holding card 110 is accidentally removed from socket 100. The break in contact between the card detect pins of the socket connector 100 and card connector 104 generates an interrupt 210 that is communicated to the interrupt input INT 212 of the CPU 202 (step 300). At this point, the processor begins execution of the interrupt handler of the present invention at address IP6, and stores NIP5 on the stack (step 302).

The purpose of the interrupt handler is to enable the system to recover after card removal. In one embodiment, execution may be resumed from the card after reinsertion. Alternatively, if the card is not reinserted, the stack must be "cleaned up" and execution carried out off-card.

As one of its first tasks, the interrupt handler disables the signal lines (step 304) before the signal pin section of the socket connector 100 begins to be pulled out of the card connector 104 (Step 306). As mentioned above, the socket connector 100 is designed so that the interrupt handler has sufficient time to perform this task before the signal pins scrape against its contacts in the card connector 104 and generate noise on the signal lines.

In the first embodiment, the interrupt handler outputs to a graphic display 208 a message to the user requesting that the card 110 with the accompanying connector 104 be reinserted (step 308). If the card 110 is reinserted into socket 100, the card detect pins of the socket connector 100 regain contact with the card connector 104. This condition is detected at the INT input 212 of the CPU 202. Upon reinsertion, the interrupt handler permits execution to resume from where it left off, i.e., at NIP5 (steps 310, 312).

If, however, the card is not reinserted, then the stack 206 is left with stack frames that refer to addresses on the card memory 110 and local variables used by the card-resident code. Thus, portions of the stack are useless and would lead to invalid system operation because they refer to instructions in a now nonexistent program memory card.

One solution provided by the present invention is to collapse the stack and eliminate all frames associated with code that attempts to access locations on the card and frames associated with code that relies on variables computed by the card-resident program (step 314). This solution may be combined with the first embodiment, as shown in FIG. 3. In this example, NIP4 and NIP5 are card addresses. Thus, the frames containing NIP4 and NIP5 would be popped off the stack 206. Moreover, if the block of application program code containing address NIP3 depends on the results of card-resident computations, then the interrupt handler would also pop the frame containing NIP3 off stack 206. It may also be the case that the calling routine of the application beginning at IP2 uses the card-resident results. In that case the frame referring to NIP2 would be popped off the stack 206, thus completely aborting the application program and eliminating all reference to it from stack 206. As a result, the interrupt handler would designate a new top of the stack at stack pointer SP1, which in this case points to NIP1, the address of the next instruction in the operating system program. Execution would then resume at NIP1.

Another embodiment of the invention uses application-specific recovery code to provide further recovery from card removal interrupts. In this embodiment, the card-resident code stores global variables in main memory. A section of recovery code is associated with the particular application that accessed the card resident program. The recovery code uses the global variables to ensure completely reliable system operation. Upon start-up of the application or before the application calls the card-resident code, the application passes the address of the recovery code for that application to the interrupt handler. Upon interrupt, the interrupt handler cleans up the stack in the manner described with respect to the previous embodiment. In addition, the interrupt handler transfers control to the recovery code, which essentially performs interrupt handling specific to the application (step 316).

A practical example of the use of application-specific recovery code will now be described. In this example, the block of code beginning at address IP3 represents an editor application program for a word processor. The routine for providing a global search and replace function is found on card 110 starting at address IP4. In response to a user request for global replacement, the editor application transfers control to the card-resident routine at IP4. As the routine performs substitutions it stores global variables in main memory indicating the text locations that have been subject to replacement. Assume that midway through the global replacement, the card connector 104 is accidentally removed from socket 100. At this point only a portion of the selected word strings have been replaced, leaving the text in an inconsistent state.

Control is then transferred to the interrupt handling code at IP6. In addition to collapsing the stack, the interrupt handler transfers control to the recovery code. The recovery code for the editor application may output a query to the user inquiring whether the user would like to "undo" the partially made changes so that the word strings selected for replacement are at least consistently the same, i.e., unchanged. If the user responds affirmatively, then, using the global variables stored by the card-resident routine, the recovery code replaces the substituted strings indicated by the global variables with the original text, returning the text to its original state.

Of course, recovery code is not limited to "undoing" changes made by card-resident routines. A wide variety of possibilities are available. For example, the recovery code may be made somewhat redundant vis-a-vis the card code, and be used to complete interrupted card functions.

Although the invention has been described in conjunction with various embodiments, it will be appreciated that modifications and alterations might be made by those skilled in the art without departing from the spirit and scope of the invention.

What is claimed is:

1. In an electrical system, an apparatus for handling the removal of a connector from the electrical system, the apparatus comprising:
   a socket for receiving said connector, said socket comprising:
      a first section of detect pins, wherein said detect pins engage with said connector when said connector is inserted into said socket; and
      a second section of signal pins, wherein said signal pins engage with said connector when said connector is inserted into said socket, said second section aligned with said first section at a first position along an axis of removal during full insertion of said connector into said socket, said second section slidable in a direction of removal to a second position along said axis during removal of said connector from said socket, wherein during removal of said connector said detect pins disengage from said connector before said second section is slid to said second position; and
   a sliding mechanism for slidably coupling said first section to said second section, wherein said first section is integrated with said second section to form said socket distinct from said connector.

2. The apparatus of claim 1, further comprising a detent mounted to said first section, said second section including a groove disposed in the direction of removal, said detent disposed in said groove, said second position being determined by the length of said groove.

3. The apparatus of claim 1, wherein said sliding mechanism includes a spring coupling said first section to said second section, said spring disposed in the direction of removal and exerting a spring force in a direction opposite the direction of removal.

4. The apparatus of claim 1, wherein said connector is a card connector coupled to a memory card, the memory card for storing executable instructions, the apparatus further comprising an interrupt handler having:
   circuitry for transferring control to said interrupt handler upon a break in contact between said card connector and said detect pins in said socket; and
   circuitry for disabling signal lines connected to said signal pins before said second section begins pulling out from said card connector upon removal of said card connector from said socket.

5. The apparatus of claim 4 further comprising:
   circuitry for displaying on an output device a request for reinsertion of said card connector into said socket.

6. The apparatus of claim 4 further comprising:
   a stack for storing stack frames; and
   circuitry for resetting a stack pointer to designate as a top of stack location a stack frame not associated with code that attempts to access addresses on said card, said card connector having been removed from said socket.

7. The apparatus of claim 6, said circuitry for resetting further comprising circuitry for designating as a top of stack location a stack frame neither associated with code that attempts to access addresses on said card, nor code that relies on variables computed by card resident code.

8. The apparatus of claim 4, further comprising circuitry for locating and executing recovery code associated with program code in a main memory, wherein said program code calls for execution of card resident code.

9. The apparatus of claim 1, wherein the electrical system is a computer system and said connector is a card connector coupled to a memory card, said memory card for storing executable instructions.

10. In an electrical system, an apparatus for handling the removal of a connector from the electrical system, the apparatus comprising:
   socket means for receiving said connector, said socket means comprising:
      first means for conveying detect signals, wherein said first means engages with said connector when said connector is inserted into said socket means; and
      second means for conveying data and control signals, wherein said means engages with said connector when said connector is inserted into said socket means, said second means aligned with said first means at a first position along said axis of removal during full insertion of said connector into said socket means, said second means slidable in a direction of removal to a second position along said axis during removal of said connector from said socket means, wherein during removal of said connector said first means conveys a detect signal that indicates connector removal before said second means is slid to said second position; and sliding means for slidably coupling said first means to said second means, wherein said first means is integrated with said second means to form said socket means distinct from said connector.

11. The apparatus of claim 10, said sliding means for returning said second means from said second position to said first position upon decoupling of said connector from said second means.

12. The apparatus of claim 10, wherein said connector is a card connector coupled to a memory card, the memory card for storing executable instructions, the apparatus further comprising an interrupt handler having:

means for transferring control to said interrupt handler upon a break in contact between said card connector and said first means; and means for disabling signal lines connected to said second means before said second means begins decoupling from said card connector upon removal of said card connector from said socket means.

13. The apparatus of claim 12, further comprising:

means for displaying on an output device a request for reinsertion of said card connector into said socket means.

14. The apparatus of claim 12, further comprising:

stack means for storing stack frames; and means for resetting a stack pointer to designate as a top of stack location a stack frame not associated with code that attempts to access addresses on said card, said card connector having been removed from said socket means.

15. The apparatus of claim 14, said means for resetting further comprising means for designating as a top of stack location a stack frame neither associated with code that attempts to access addresses on said card, nor code that relies on variables computed by card resident code.

16. The apparatus of claim 12, further comprising means for locating and executing recovery code associated with program code in a main memory, wherein said program code calls for execution of card resident code.

17. The apparatus of claim 10, wherein the electrical system is a computer system and said connector is a card connector coupled to a memory card, said memory card for storing executable instructions.

18. A method for handling the removal of a connector from a socket, wherein said connector is capable of being removed from said socket along an axis of removal, said socket comprising a first section of detect pins and a second section of signal pins, wherein said detect pins and said signal pins engage with said connector when said connector is inserted into said socket, said second section aligned with said first section at a first position along said axis of removal during full insertion of said connector into said socket, said second section slidable in a direction of removal to a second position along said axis during removal of said connector from said socket, wherein during removal of said connector said detect pins disengage from said connector before said second section is slid to said second position, said socket further including a sliding mechanism for slidably coupling said first section to said second section, wherein said first section is integrated with said second section to form said socket distinct from said connector, the method comprising the steps:

initiating removal of said connector from said socket;

sliding said second section in said direction of removal as said connector is removed from said socket; and breaking contact between said connector and said detect pins in said socket.

19. The method of claim 18, further comprising the steps of:

continuing to slide said second section in said direction of removal until said second section reaches said second position;

breaking contact between said connector and said signal pins; and returning said second section to said first position using a spring force opposite the direction of removal.

20. The method of claim 18, further comprising the steps of:

detecting a break in contact between said connector and said detect pins; and disabling signal lines connected to said signal pins.

21. The method of claim 20, wherein said connector is a card connector coupled to a memory card, the memory card for storing executable instructions, the method further comprising the step of transferring control to an interrupt handler upon detecting said break in contact between said card connector and said detect pins.

22. The method of claim 20, further comprising the step of displaying on an output device a request for reinsertion of said card connector into said socket.

23. The method of claim 20, further comprising the step of resetting a stack pointer to designate as a top of stack location a stack frame not associated with code that attempts to access addresses on said card.

24. The method of claim 20, further comprising the step of locating and executing recovery code associated with program code in a main memory, wherein said program code calls for execution of card-resident code.

25. The method of claim 18, said connector is a card connector coupled to a memory card, said memory card for storing executable instructions.

26. A computer system capable of executing instructions off of a memory card comprising:

a processor;

a bus;

a memory card;

a card connector coupled to said memory card;

a socket coupled to said bus, said socket for receiving said card connector, said socket including:

a first section of card detect pins, wherein said detect pins engage with said connector when said connector is inserted into said socket; and a second section of signal pins, wherein said signal pins engage with said connector when said connector is inserted into said socket, said second section aligned with said first section at a first position along an axis of card removal during full insertion of said card connector into said socket, said second section slidable in a direction of card removal to a second position along said axis during removal of said card connector from said socket, wherein during removal said card detect pins disengage from said card before said second section is slid to said second position; and a sliding mechanism for slidably coupling said first section to said second section, wherein said first section is integrated with said second section to form said socket distinct from said connector.

27. The system of claim 26, wherein said sliding mechanism includes a spring coupling said first section to said second section, said spring disposed in the direction of card removal and exerting a spring force in a direction opposite the direction of card removal.

28. The system of claim 26, further comprising:

an interrupt handler having:
   circuitry for transferring control to said interrupt handler upon a break in contact between said card connector and said card detect pins in said socket; and
   circuitry for disabling signal lines connected to said signal pins before said second section begins pulling out from said card connector upon removal of said card connector from said socket.

29. The system of claim 28, further comprising:

an output device coupled to said bus; and circuitry for displaying on said output device a request for reinsertion of said card connector into said socket.

30. The system of claim 28 further comprising:

a stack coupled to said processor for storing stack frames; and circuitry for resetting a stack pointer to designate as a top of stack location a stack frame not associated with code that attempts to access addresses on said card, said card connector having been removed from said socket.

31. The system of claim 28, further comprising circuitry for locating and executing recovery code associated with program code, wherein said program code calls for execution of card resident code.

32. A computer system capable of executing instructions off of a memory card comprising:

processor means for processing information;

a memory card;

a card connector coupled to said memory card;

a bus;

socket means, coupled to said bus, for receiving said card connector, said socket means including:
   first means for conveying card detect signals, wherein said first means engages with said connector when said connector is inserted into said socket means; and
   second means for conveying data and control signals, wherein said second means engages with said connector when said connector is inserted into said socket means, said second means aligned with said first means at a first position along an axis of card removal during full insertion of said card into said socket means, said second means slidable in a direction of card removal to a second position along said axis during removal of said card from said socket means, wherein during removal said first means conveys a card detect signal that indicates card removal before said second means is slid to said second position; and sliding means for slidably coupling said first means to said second means, wherein said first means is integrated with said second means to form said socket means distinct from said connector.

33. The system of claim 32, said sliding means for returning said second means from said second position to said first position upon decoupling of said card connector from said second means.

34. The system of claim 32, further comprising an interrupt handler having:

means for transferring control to said interrupt handler upon a break in contact between said card connector and said first means; and means for disabling signal lines connected to said second means before said second means begins decoupling from said card connector upon removal of said card connector from said socket means.

35. The system of claim 34, further comprising:

an output device; and means for displaying on said output device a request for reinsertion of said card connector into said socket means.

36. The system of claim 34, further comprising:

stack means for storing stack frames; and means for resetting a stack pointer to designate as a top of stack location a stack frame not associated with code that attempts to access addresses on said card, said card connector having been removed from said socket means.

37. The system of claim 36, said means for resetting further comprising means for designating as a top of stack location a stack frame neither associated with code that attempts to access addresses on said card, nor code that relies on variables computed by card resident code.

38. The system of claim 28, further comprising means for locating and executing recovery code associated with program code, wherein said program code calls for execution of card resident code.

* * * * *